United States Patent
Kasai

(10) Patent No.: US 7,151,536 B2
(45) Date of Patent: Dec. 19, 2006

(54) ELECTRONIC CIRCUIT, ELECTRO-OPTICAL UNIT, AND ELECTRONIC APPARATUS

(75) Inventor: Toshiyuki Kasai, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 546 days.

(21) Appl. No.: 10/683,347

(22) Filed: Oct. 14, 2003

(65) Prior Publication Data

US 2004/0113874 A1    Jun. 17, 2004

(30) Foreign Application Priority Data

Oct. 17, 2002    (JP)    ............... 2002-303211

(51) Int. Cl.
    *G09G 5/00*    (2006.01)
(52) U.S. Cl. ............ 345/212; 345/76; 345/82; 345/690; 315/169.1; 315/169.3
(58) Field of Classification Search ............ 345/76–82, 345/205, 208, 211–214, 690; 315/169.3, 315/169.1, 169.4
See application file for complete search history.

(56) References Cited

U.S. PATENT DOCUMENTS

| | | | |
|---|---|---|---|
| 6,462,722 B1 | 10/2002 | Kimura et al. | |
| 6,498,438 B1 * | 12/2002 | Edwards | 315/169.3 |
| 6,753,654 B1 * | 6/2004 | Koyama | 315/169.1 |
| 6,756,951 B1 | 6/2004 | Ishizuka et al. | |
| 6,914,390 B1 * | 7/2005 | Koyama | 315/169.3 |
| 6,989,826 B1 * | 1/2006 | Kasai | 345/204 |
| 7,042,162 B1 * | 5/2006 | Yamazaki et al. | 315/169.1 |
| 7,046,240 B1 * | 5/2006 | Kimura | 345/212 |
| 2003/0227262 A1 * | 12/2003 | Kwon | 315/169.3 |
| 2005/0041002 A1 * | 2/2005 | Takahara et al. | 345/76 |

FOREIGN PATENT DOCUMENTS

| | | |
|---|---|---|
| JP | A-2001-042827 | 2/2001 |
| WO | WO98/36406 | 8/1998 |

* cited by examiner

*Primary Examiner*—Henry N. Tran
(74) *Attorney, Agent, or Firm*—Oliff & Berridge, PLC

(57) ABSTRACT

The invention provides an electronic circuit, an electro-optical unit, and an electronic apparatus with a reduced data writing time. A final current-conversion circuit segment includes a first driving transistor and a first current-supply transistor with a gain factor k times that of the first driving transistor. Further, a current-conversion circuit segment includes a second driving transistor and a second current-supply transistor with a gain factor k times that of the second driving transistor. An intermediate current that is k times the data current Idata generated in the second driving transistor included in the current-conversion circuit segment is supplied to the first current-supply transistor in the final current-conversion circuit segment.

15 Claims, 6 Drawing Sheets

ELECTRONIC CIRCUIT, ELECTRO-OPTICAL UNIT, AND ELECTRONIC APPARATUS

BACKGROUND OF THE INVENTION

1. Field of Invention

The present invention relates to electronic circuits, electro-optical units, and electronic apparatuses.

2. Description of Related Art

Related art electro-optical units include electro-optical devices, such as organic electroluminescent (EL) devices. Since the organic EL devices are light emitting devices requiring no backlight, electro-optical units of low power consumption, a wide viewing angle, and a high contrast are advantageous.

Among electro-optical units of this type, an active-matrix unit has a display panel that includes pixel circuits to control a driving current supplied to an organic EL device.

A pixel circuit includes a capacitor to retain electric charge corresponding to the amount of data current, and a transistor to control the driving current based on the amount of electric charge retained (for example, as disclosed in International Publication No. WO98/36406.

SUMMARY OF THE INVENTION

It is advantageous for electro-optical units that the quality of display be enhanced by reduced time of writing data current to the pixel circuits and by increased halftones of organic EL devices.

Accordingly, the present invention provides an electronic circuit, an electro-optical unit, and an electronic apparatus that can reduce the time of writing data current.

An electronic circuit according to the present invention includes a first current converter that converts a first current signal input to a second current signal having a value different from that of the first current signal; a second current converter that converts a third current signal input to a fourth current signal having a value different from that of the third current signal; and an electronic device to which the second current signal is input. The fourth current signal is the first current signal.

This limits the expansion of the areas occupied by the transistors included in the electronic circuit.

In this electronic circuit, the first current converter has a storage to retain the first current signal or the second current signal.

This allows constant generation of a second current signal having a current level corresponding to a first current signal.

In this electronic circuit, the first current converter has a plurality of transistors with different gains.

This allows generation of a second current signal having a current level corresponding to a first current signal.

In this electronic circuit, the second current converter has a plurality of transistors with different gains.

This allows generation of a fourth current signal having a current level corresponding to a third current signal.

In this electronic circuit, the electronic device is a current drive device.

This limits the expansion of the areas occupied by the transistors included in the electronic circuit, whereas allowing generation of a third current signal having a current value greater than that of a second current signal supplied to a current drive device.

In this electronic circuit, the current drive device is an EL device.

This limits the expansion of the areas occupied by the transistors included in the electronic circuit, whereas allowing generation of a third current signal having a current value greater than that of a second current signal supplied to an EL device.

An electro-optical unit according to the present invention includes a plurality of data lines, scan lines, electro-optical devices, and unit electronic circuits. Each unit electronic circuit includes a first current converter that is connected to the plurality of scan lines and converts a first current signal input to a second current signal having a value different from that of the first current signal; and a second current converter that is connected to one of the plurality of data lines and converts a third current signal input to a fourth current signal having a value different from that of the third current signal. The second current signal is input to the electro-optical devices; and the fourth current signal is the first current signal.

This limits the expansion of the areas occupied by the transistors included in the electro-optical unit.

In this electro-optical unit, the first current converter has a storage to retain the first current signal or the second current signal.

This allows constant generation of a second current signal having a current level corresponding to a first current signal.

In this electro-optical unit, the first current converter has a plurality of transistors with different gains.

This allows generation of a second current signal having a current level corresponding to a first current signal.

In this electro-optical unit, the second current converter has a plurality of transistors with different gains.

This allows generation of a fourth current signal having a current level corresponding to a third current signal.

In this electro-optical unit, the electronic device is an organic EL device.

This limits the expansion of the areas occupied by the transistors included in the electronic circuit, whereas allowing generation of a third current signal having a current value greater than that of a second current signal supplied to an organic EL device.

An electronic apparatus according to the present invention has the electronic circuits described above.

Thus, an electronic apparatus having electronic circuits limiting the expansion of the areas occupied by the transistors included in the electronic circuits can be provided.

This electronic apparatus has the electro-optical unit described above.

Thus, an electronic apparatus having the electro-optical unit limiting the expansion of the areas occupied by the transistors included in the electro-optical unit can be provided.

DETAILED DESCRIPTION OF PREFERRED EMBODIMENTS

First Exemplary Embodiment

Figure 1:
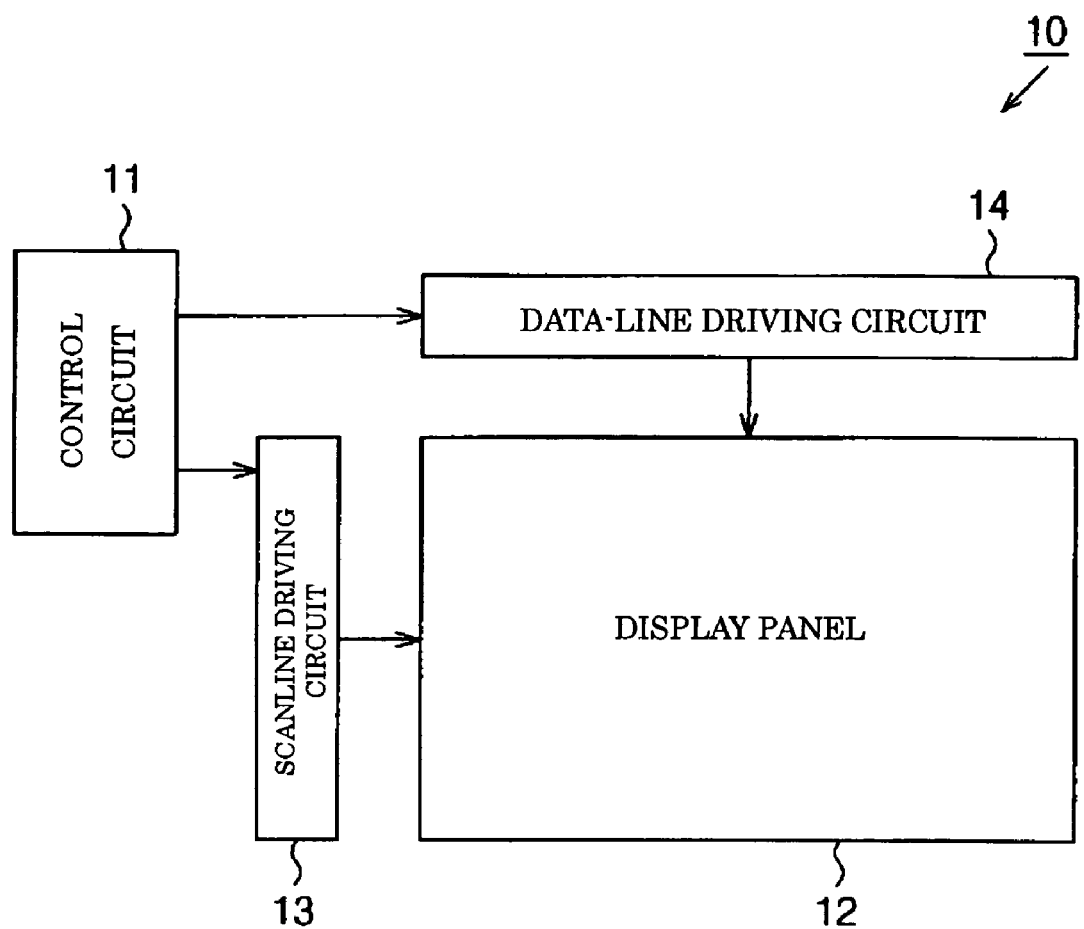
FIG. 1 is a schematic showing a circuit configuration of an organic EL display according to an exemplary embodiment of the present invention.
Figure 2:
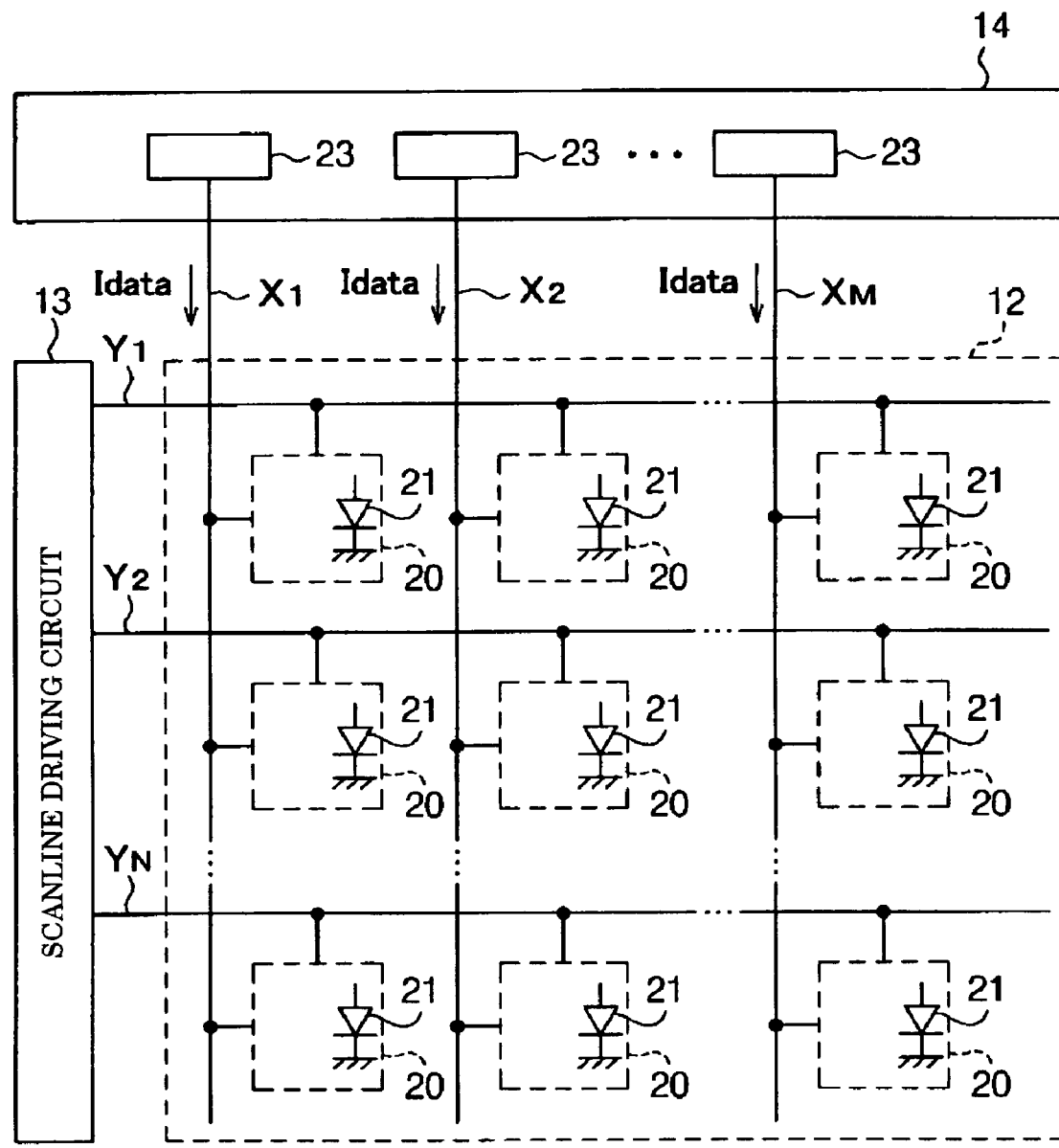
FIG. 2 is a schematic showing an interior configuration of a display panel and a data-line driving circuit.
Figure 3:
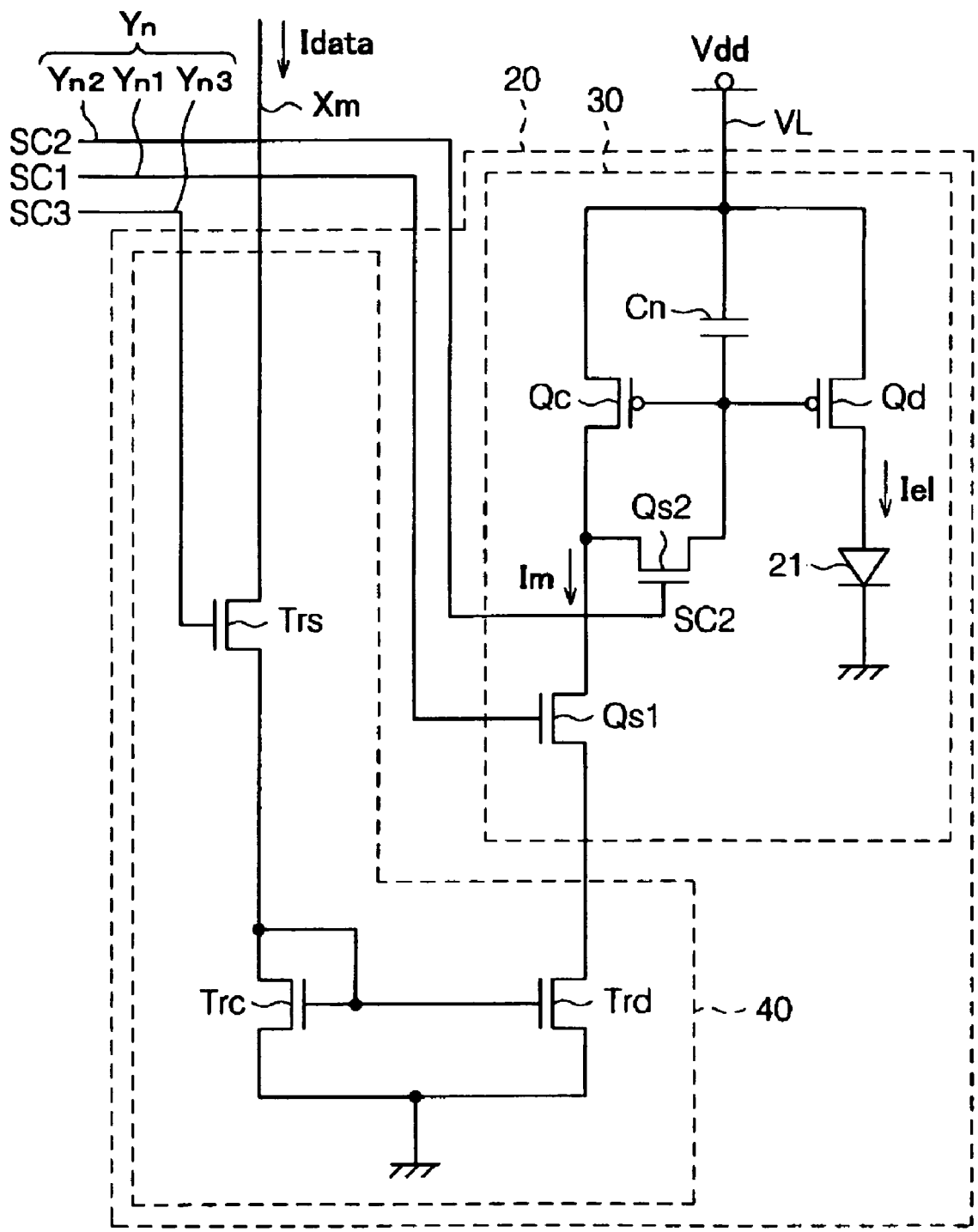
FIG. 3 is a schematic showing a pixel circuit according to a first exemplary embodiment of the present invention.
Figure 4:
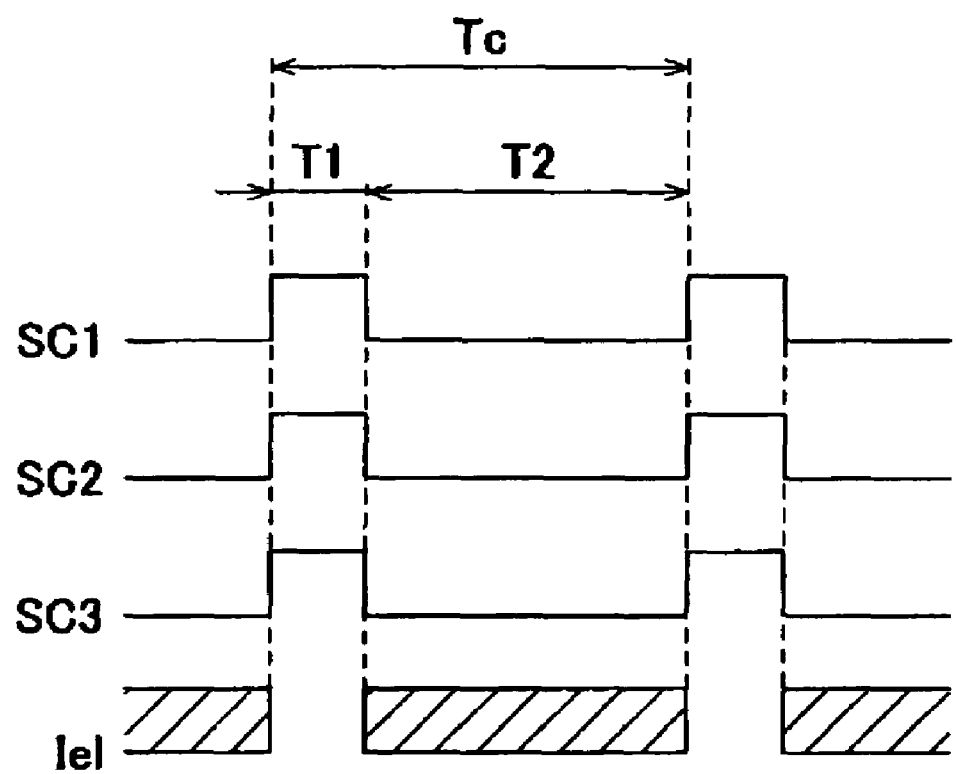
FIG. 4 is a timing chart showing an operation of the pixel circuit according to the first exemplary embodiment of the present invention.

The first exemplary embodiment of the present invention is described below with reference to FIGS. 1 to 4. FIG. 1 is a schematic showing a circuit configuration of an organic EL display as an electro-optical unit. FIG. 2 is a schematic showing a configuration of a display panel and a data-line driving circuit. FIG. 3 is a schematic showing a pixel circuit as an electronic circuit or a unit electronic circuit. FIG. 4 is a timing chart showing an operation of the pixel circuit.

Referring to FIG. 1, an organic EL display 10 includes a control circuit 11, a display panel 12, a scanline driving circuit 13, and a data-line driving circuit 14. The organic EL display 10 according to the present exemplary embodiment has current-programmable pixel circuits therein.

In the organic EL display 10, the control circuit 11, the scanline driving circuit 13, and the data-line driving circuit 14, may be separate electronic components.

For example, each of the control circuit 11, the scanline driving circuit 13, and the data-line driving circuit 14 may be a single semiconductor integrated-circuit (IC) chip.

Alternatively, at least one of the control circuit 11, the scanline driving circuit 13, and the data-line driving circuit 14 may be a programmable IC chip so that software programs written in the IC chip can operate the circuits.

The control circuit 11 generates scan control signals and data control signals, based on image data from an external device (not shown), to display intended images on the display panel 12. The control circuit 11 then outputs scan control signals and data control signals to the scanline driving circuit 13 and the data-line driving circuit 14, respectively.

Referring now to FIG. 2, the display panel 12 includes a plurality of pixel circuits 20 arranged in a matrix, each having an organic EL device 21, which is composed of light-emitting layers of organic materials, as an electronic device, a current drive device, or an electro-optical device. That is, each pixel circuit 20 is arranged in the vicinity of the corresponding intersection of M data lines Xm (m is an integer ranging from 1 to M) along columns and N scanlines Yn (n is an integer ranging from 1 to N) along rows. In this exemplary embodiment, the organic EL device 21 emits light in response to a driving current Ie1 as a second current signal that is about 1/100 of a data current Idata as a third current signal generated in the data-line driving circuit 14. Transistors arranged in the pixel circuit 20, which will be described below, are usually thin-film transistors (TFTs).

In response to scan control signals from the control circuit 11, the scanline driving circuit 13 selects one of the N scanlines Yn in the display panel 12 and outputs a scanning signal to the scanline selected.

The data-line driving circuit 14 has a plurality of single line-drivers 23, each connected to the data line Xm in the display panel 12. Each single line-driver 23 generates a data current Idata depending on the data control signals from the control circuit 11, supplying the data current Idata generated to the each pixel circuit 20 via the data line Xm. In response to the data current Idata supplied, the pixel circuit 20 adjusts the internal state thereof to control the driving current Ie1 flowing into the organic EL device 21, and thus for controlling the luminance and the gray scale of the organic EL device 21.

Referring to FIG. 3, the pixel circuit 20 in the organic EL display 10 is explained below. Since all pixel circuits 20 have the identical configuration, the explanation refers only to the pixel circuit 20 in the vicinity of the intersection of the m-th data line Xm and the n-th scanline Yn.

The pixel circuit 20 includes a final current-conversion circuit segment 30 as a first current converter and a current-conversion circuit segment 40 as a second current converter.

The final current-conversion circuit segment 30 includes a first driving transistor Qd, a first current-supply transistor Qc, a first switching transistor Qs1, and a second switching transistor Qs2. The final current-conversion circuit segment 30 also includes a storage capacitor Cn as a storage and the organic EL device 21.

The first driving transistor Qd has a gain factor $\beta d1$ as driving efficiency and functions as a driving transistor. The first current-supply transistor Qc has a gain factor $\beta c1$ as driving efficiency and also functions as a driving transistor. The first and second switching transistors Qs1 and Qs2, respectively, are on/off controlled by the scanning signals SC1 and SC2 from the scanline driving circuit 13 and thus function as switching transistors.

In this exemplary embodiment, the first driving transistor Qd and the first current-supply transistor Qc have p-type (p-channel) conductivity, whereas the first and second switching transistors Qs1 and Qs2 have n-type (n-channel) conductivity.

The source of the first driving transistor Qd is connected to a voltage line VL that supplies a driving voltage Vdd. The drain of the first driving transistor Qd is connected to one terminal of the organic EL device 21. The other terminal of the organic EL device 21 is grounded. The storage capacitor Cn is connected to both the gate and source of the first driving transistor Qd.

The gate of the first driving transistor Qd is connected to the gate of the first current-supply transistor Qc.

The source of the first current-supply transistor Qc is connected to the voltage line VL. The drain of the first current-supply transistor Qc is connected to the drain of the first switching transistor Qs1. The gate of the first switching transistor Qs1 is connected to a first sub-scanline Yn1 that is further connected to the scanline driving circuit 13.

The gate and drain of the first current-supply transistor Qc are electrically connectable with each other via a second switching transistor Qs2. The gate of the second switching transistor Qs2 is connected to a second sub-scanline Yn2 that is further connected to the scanline driving circuit 13.

Accordingly, when a second scanning signal SC2 from the scanline driving circuit 13 turns the second switching transistor Qs2 into an "ON" state, the first current-supply transistor Qc is diode-connected. This diode-connection allows the first driving transistor Qd and the first current-supply transistor Qc to form a current mirror circuit.

The ratio of gain factors $\beta d1$ and $\beta c1$ of the first driving transistor Qd and the first current-supply transistor Qc, respectively, is predetermined at $\beta d1:\beta c1=1:10$. Therefore, an intermediate current as a first or fourth current signal passing through the first current-supply transistor Qc is 10 times the driving current Ie1 generated in the first driving transistor Qd. The intermediate current Im is represented by the gain factors $\beta d1$ and $\beta c1$ of the first driving transistor Qd and the first current-supply transistor Qc, as follows:

$$Im = Ie1 \cdot (\beta c1/\beta d1) = 10 Ie1$$

Accordingly, the final current-conversion circuit segment 30 can provide the intermediate current Im that is 10 times the driving current Ie1 supplied to the organic EL device 21.

In this case, if each channel length of the first driving transistor Qd and the first current-supply transistor Qc is assumed to be substantially the same, the gain factor βd1 of the first driving transistor Qd is proportional to the occupied area SQd of the first driving transistor Qd, and the gain factor βc1 of the first current-supply transistor Qc is proportional to the occupied area SQc of the first current-supply transistor Qc.

As a result, the occupied area SQc of the first current-supply transistor Qc is about 10 times the occupied area SQd of the first driving transistor Qd:

SQc=10SQd

The current-conversion circuit segment 40 is explained below. The current-conversion circuit segment 40 includes a second driving transistor Trd, a second current-supply transistor Trc, and a third switching transistor Trs.

The second driving transistor Trd has a gain factor βd2 as driving efficiency and functions as a driving transistor.

The second current-supply transistor Trc has a gain factor βc2 as driving efficiency and also functions as a driving transistor. The gate of the third switching transistor Trs is electrically connected to the scanline driving circuit 13 via a third sub-scanline Yn3. The third switching transistor Trs is on/off controlled by the scanning signal SC3 from the scanline driving circuit 13.

In this exemplary embodiment, the second driving transistor Trd, the second current-supply transistor Trc, and the third switching transistor Trs have n-type (n-channel) conductivity.

The drain of the second driving transistor Trd is connected to the source of the first switching transistor Qs1 in the final current-conversion circuit segment 30. The source of the second driving transistor Trd is grounded together with the source of the second current-supply transistor Trc. The gate of the second driving transistor Trd is connected to the gate of the second current-supply transistor Trc.

The drain of the second current-supply transistor Trc is connected to the source of the third switching transistor Trs. The second current-supply transistor Trc is diode-connected. That is, this allows the second driving transistor Trd and the second current-supply transistor Trc to form a current mirror circuit.

The drain of the third switching transistor Trs is electrically connected to the single line-driver 23 in the data-line driving circuit 14 via the data line Xm. The gate of the third switching transistor Trs is connected to the third sub-scanline Yn3 that is further connected to the scanline driving circuit 13.

The ratio of gain factors βd2 and βc2 of the second driving transistor Trd and the second current-supply transistor Trc, respectively, is predetermined at βd2:βc2=1:10. Therefore, the data current Idata passing through the second current-supply transistor Trc is 10 times the intermediate current Im generated in the second driving transistor Trd. Namely, the data current Idata is expressed as follows:

$$Idata = Im \cdot (\beta c2 / \beta d2)$$
$$= 10Im$$

Accordingly, the current-conversion circuit segment 40 can provide the data current Idata that is 10 times the intermediate current Im supplied to the final current-conversion circuit segment 30.

In this case, if each channel length of the second driving transistor Trd and the second current-supply transistor Trc is assumed to be substantially the same, the gain factor βd2 of the second driving transistor Trd is proportional to the occupied area STrd of the second driving transistor Trd, and the gain factor βc2 of the second current-supply transistor Trc is proportional to the occupied area STrc of the second current-supply transistor Trc.

As a result, the occupied area STrc of the second current-supply transistor Trc is about 10 times the occupied area STrd of the second driving transistor Trd:

STrc=10STrd

The first, second, and third sub-scanlines Yn1, Yn2, and Yn3 constitute the scanline Yn. The scanline driving circuit 13 outputs the first, second, and third scanning signals SC1, SC2, and SC3 to the first, second, and third sub-scanlines Yn1, Yn2, and Yn3, respectively, at a predetermined timing.

The data current Idata may be represented by the driving current Ie1, as follows:

$$Idata = Im \cdot (\beta c2 / \beta d2)$$
$$= 10Im$$
$$= 10Ie1 \cdot (\beta d2 / \beta d1)$$
$$= 100Ie1$$

Thus, by configuring the pixel circuit 20 as described above, a pixel circuit which supplies the data current Idata 100 times the driving current Ie1 can be achieved.

The total occupied area St of all the seven transistors in the pixel circuit 20 is the sum of the occupied areas SQc and STrc of the first and second current-supply transistors Qc and Trc, respectively, the occupied areas SQd and STrd of the first and second driving transistors Qd and Trd, respectively, and the occupied areas of the first, second, and third switching transistors. The total occupied area St of all the seven transistors may be expressed as follows:

St=SQc+STrc+SQd+STrd+SQs1+SQs2+STrs where the occupied areas of the first, second, and third switching transistors Qs1, Qs2, and Trs are indicated by SQs1, SQs2, and STrs, respectively.

The total occupied area St of all the seven transistors may also be expressed as follows:

$$St = 10SQd + 10STrd + SQd + STrd + SQs1 + SQs2 + STrs$$
$$= 11SQd + 11STrd + SQs1 + SQs2 + STrs$$

where the occupied area STrc of the second current-supply transistor Trc is substituted for the occupied area STrd of the second driving transistor Trd, and the occupied area SQc of the first current-supply transistor Qc is substituted for the occupied area SQd of the first driving transistor Qd.

Since all the first, second, and third switching transistors Qs1, Qs2, and Trs, respectively, function as switching transistors, assume that their occupied areas SQs1, SQs2, and STrs are substantially equal, and that occupied areas SQs1, SQs2, and STrs of the first, second, and third switching transistors, respectively, are substantially equal to the occupied area SQd of the first driving transistor Qd. In this case, the relationships between the occupied areas SQs1, SQs2, and STrs of the first, second, and third switching transistors Qs1, Qs2, and Trs, respectively, and the occupied area SQd of the first driving transistor Qd may be expressed as follows:

SQs1=SQs2=STrs=SQd

Substituting these relationships into the total occupied area St of all the transistors, St may be expressed as follows:

$$St = 11SQd + 11STrd + SQs1 + SQs2 + STrs$$
$$= 14SQd + 11STrd$$

If the occupied area SQd of the first driving transistor Qd and the occupied area STrd of the second driving transistor Trd are assumed to be substantially equal, the total occupied area St of all the transistors may be expressed as follows:

$$St = 14SQd + 11STrd$$
$$= 25SQd$$

For comparison, the occupied area Ao of all the transistors in a pixel circuit not including the current-conversion circuit segment 40 and thus only including the final current-conversion circuit segment 30 will be determined. In the pixel circuit consisting only of the final current-conversion circuit segment 30, assume that the gain factor of the first current-supply transistor Qc is 100 times that of the first driving transistor Qd. This assumption allows the pixel circuit consisting only of the final current-conversion circuit segment 30 to supply the same level of data current Idata as the pixel circuit 20, which includes the final current-conversion circuit segment 30 and the current-conversion circuit segment 40, supplies to the storage capacitor Cn.

As described above, occupied areas of transistors increase with gain factors. In the pixel circuit with no current-conversion circuit segment 40, therefore, the occupied area of the first current-supply transistor Qc is 100 times that of the first driving transistor Qd. The relationship between the occupied area SQc of the first current-supply transistor Qc and the occupied area SQd of the first driving transistor Qd may be expressed as follows:

SQc=100SQd

Accordingly, the occupied area Ao may be expressed as follows:

$$Ao = SQd + SQc + SQs1 + SQs2$$
$$= SQd + 100SQd + SQs1 + SQs2$$
$$= 101SQd + SQs1 + SQs2$$

Similarly to the occupied area St of all the transistors in the pixel circuit 20, assume that the occupied areas SQs1 and SQs2 of the first and second switching transistors Qs1 and Qs2, respectively, are equal. Also assume that the occupied areas SQs1 and SQs2 of the first and second switching transistors Qs1 and Qs2 are equal to the occupied area SQd of the first driving transistor Qd. The occupied area Ao in this case is as follows:

$$Ao = 101SQs + SQs1 + SQs2$$
$$= 103SQd$$

The above-described result shows that the pixel circuit 20 in FIG. 3 can reduce the occupied areas of transistors by about 75%, while supplying the same level of data current Idata to the driving current Ie1 compared to the pixel circuit without current-conversion circuit segment 40. The reduction ratio of the occupied areas 50 of transistors increases as the ratio of the data current Idata to the driving current Ie1 increases. Therefore, the pixel circuit 20 consisting of the final current-conversion circuit segment 30 and the current-conversion circuit segment 40 has advantages of a larger aperture ratio and higher resolution of displays.

With reference to FIG. 4, a driving process of the pixel circuit 20 described above is explained. FIG. 4 is a timing chart of the first, second, and third scanning signals SC1, SC2, and SC3 output to the first, second, and third switching transistors Qs1, Qs2, and Trs, respectively, and the driving current Ie1 supplied to the organic EL device 21. In FIG. 4, Tc, T1, and T2 are a driving period, a data writing period, and a light-emitting period, respectively. The driving period Tc includes the data writing period T1 and the light-emitting period T2. The driving period Tc may also be referred to as a frame period, where both luminance and gray shades of the organic EL device 21 are updated once.

In the pixel circuit 20, during the data writing period T1, the first scanning signal SC1 from the scanline driving circuit 13 is output, via the first sub-scanline Yn1, to the gate of the first switching transistor Qs1 for turning the first switching transistor Qs1 into an "ON" state. Also in the data writing period T1, the second scanning signal SC2 from the scanline driving circuit 13 is output, via the second sub-scanline Yn2, to the gate of the second switching transistor Qs2 to turn the second switching transistor Qs2 into an "ON" state. Likewise in the data writing period T1, the third scanning signal SC3 from the scanline driving circuit 13 is output, via the third sub-scanline Yn3, to the gate of the third switching transistor Trs to turn the third switching transistor Trs into an "ON" state.

Accordingly, in the data writing period T1, the first, second, and third switching transistors Qs1, Qs2, and Trs, respectively, are all turned into an "ON" state.

This allows the data current Idata generated in the data-line driving circuit 14 to be supplied, via the data line Xm, to the current-conversion circuit segment 40. Further, the intermediate current Im that is one-tenth the data current Idata is generated in the second driving transistor Trd which constitutes a current mirror circuit together with the second current-supply transistor Trc.

The intermediate current Im generated in the second driving transistor Trd is, then, supplied to the first current-supply transistor Qc in the final current-conversion circuit segment 30. Thus, the amount of charge corresponding to this intermediate current Im is stored in the storage capacitor Cn.

Next, in the light-emitting period T2, the first scanning signal SC1 from the scanline driving circuit 13 is output, via the first sub-scanline Yn1, to the gate of the first switching transistor Qs1 for turning the first switching transistor Qs1 into an "OFF" state. Likewise in the light-emitting period T2, the second and third scanning signals SC2 and SC3 from the scanline driving circuit 13 are output, via the second and third sub-scanlines Yn2 and Yn3, respectively, to the gates of the second and third switching transistors Qs2 and Trs to turn the second and third switching transistors Qs2 and Trs into an "OFF" state.

Accordingly, in the light-emitting period T2, the first, second, and third switching transistors Qs1, Qs2, and Trs, respectively, are all turned into an "OFF" state.

Thus, in the first driving transistor Qd, the amount of the driving current Ie1 is determined based on the amount of charge stored in the storage capacitor Cn. The driving current Ie1 is one-tenth the intermediate current Im. This driving current Ie1 is supplied to the organic EL device 21 to make it emit light at a luminance and a gray shade corresponding to the data current Idata.

Preferably, the first, second, and third switching transistors Qs1, Qs2, and Trs are in an "ON" state during the data writing period T1, and are in an "OFF" state during the light-emitting period T2, although they are not limited to this. Preferably, the driving current Ie1 flows into the organic EL device 21 during the light-emitting period T2, but not during the data writing period T1, although they are not limited to this.

In the above-described exemplary embodiment, the final current-conversion circuit segment 30 includes the first driving transistor Qd with a gain factor βd1 and the first current-supply transistor Qc with a gain factor βc1 that is 10 times the gain factor βd1. Further, the current-conversion circuit segment 40 includes the second driving transistor Trd with a gain factor βd2 and the second current-supply transistor Trc with a gain factor βc2 that is 10 times the gain factor βd2. The intermediate current Irn that is one-tenth the data current Idata flowing into the second driving transistor Trd in the current-conversion circuit segment 40 is supplied to the first current-supply transistor Qc in the final current-conversion circuit segment 30. The driving current Ie1 that is one-tenth the intermediate current Im is supplied to the organic EL device 21 from the first driving transistor Qd in the final current-conversion circuit segment 30.

The data current Idata supplied to the pixel circuit 20 is eventually supplied to the organic EL device 21 after sequential changes in a current level. Thus, the reduction in occupied areas of all transistors can be achieved in the pixel circuit 20. Compared to the pixel circuit without the current-conversion circuit segment 40, the pixel circuit 20 can supply the data current Idata that is greater than the driving current Ie1 with no reduction in aperture ratio. Accordingly, while limiting a reduction in aperture ratio of the pixel circuit, the organic EL display 10 with a short writing time and an organic EL device having a wide range of halftones can be provided.

Second Exemplary Embodiment

The second exemplary embodiment of the present invention is described below with reference to FIGS. 5 and 6. Those components that are common to the first exemplary embodiment are identified by the same numerals and will not be described in detail.

Figure 5:
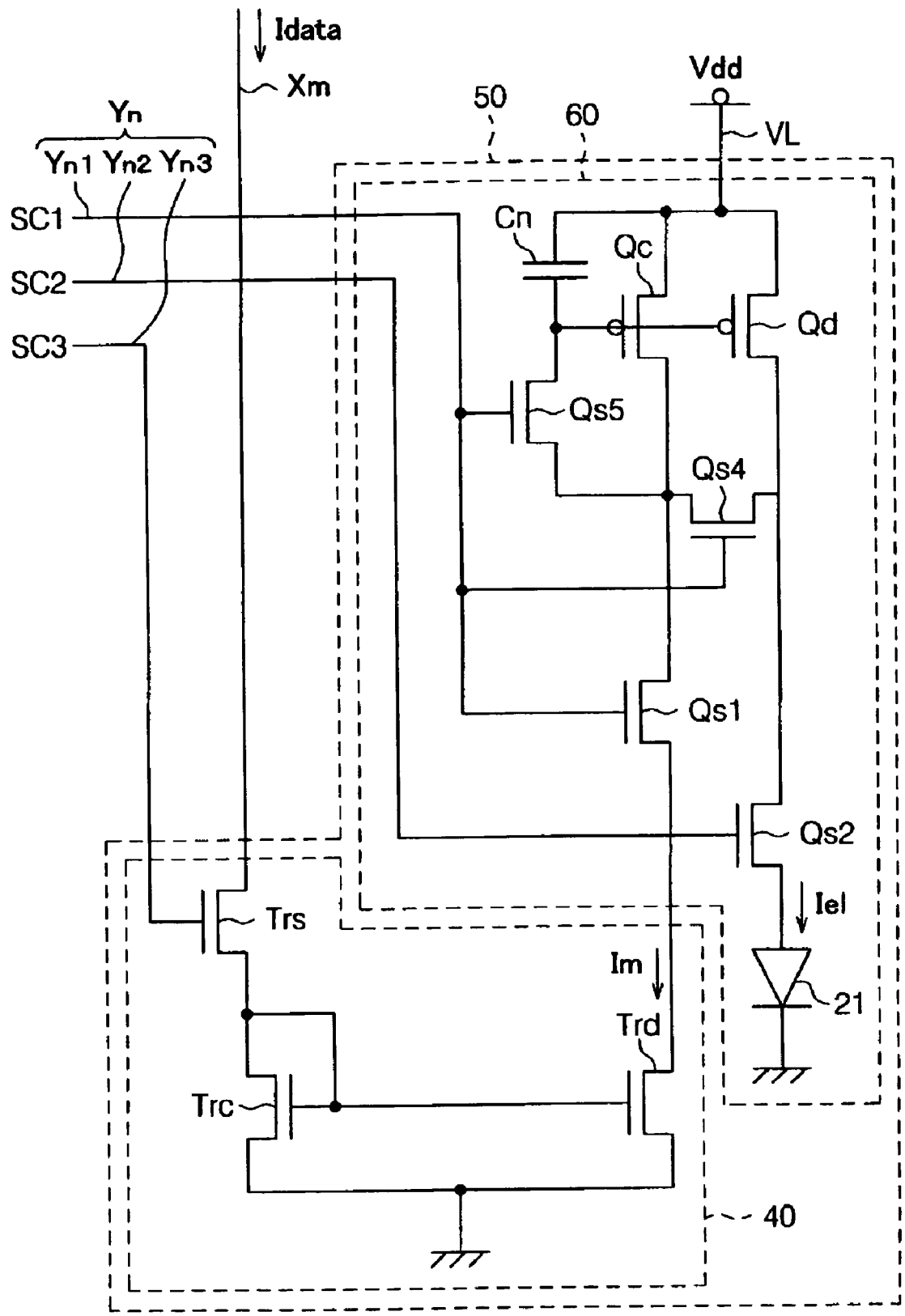
FIG. 5 is a schematic showing a pixel circuit according to a second exemplary embodiment of the present invention.

FIG. 5 is a schematic showing a pixel circuit 50 arranged in the display panel 12 of the organic EL display 10. The pixel circuit 50 includes a final current-conversion circuit segment 60 as a first current converter and a current-conversion circuit segment 40 as a second current converter.

The final current-conversion circuit segment 60 includes a first driving transistor Qd, a first current-supply transistor Qc, first and second switching transistors Qs1 and Qs2, a storage capacitor Cn, and an organic EL device 21. The final current-conversion circuit segment 60 also includes a fourth switching transistor Qs4 and a fifth switching transistor Qs5.

A conductivity type of the first driving transistor Qd and the first current-supply transistor Qc is p-type (p-channel). On the other hand, a conductivity type of the first, second, fourth, and fifth switching transistors Qs1, Qs2, Qs4, and Qs5 is n-type (n-channel).

The source of the first driving transistor Qd is connected to both the voltage line VL that supplies a driving voltage Vdd and to the source of the first current-supply transistor Qc. The gate of the first driving transistor Qd is connected to the gate of the first current-supply transistor Qc. The storage capacitor Cn is connected to both the source and gate of the first current-supply transistor Qc.

The fourth switching transistor Qs4 is connected to both the drain of the first current-supply transistor Qc and the drain of the first driving transistor Qd. When the fourth switching transistor Qs4 is turned into an "ON" state, the drain of the first current-supply transistor Qc and the drain of the first driving transistor Qd are electrically connectable with each other. Further, the gate of the first current-supply transistor Qc is connected to the drain of the fifth switching transistor Qs5, and the source of the fifth switching transistor Qs5 is connected to the drain of the first current-supply transistor Qc. That is, when the fifth switching transistor Qs5 is turned into an "ON" state, the first current-supply transistor Qc is diode-connected. Likewise, when the fourth switching transistor Qs4 and the fifth switching transistor Qs5 are turned into an "ON" state, the first current-supply transistor Qc and the first driving transistor Qd are respectively diode-connected.

The source of the fifth switching transistor Qs5 is connected to the drain of the first switching transistor Qs1. Each gate of the first switching transistor Qs1, the fourth switching transistor Qs4, and the fifth switching transistor Qs5 is connected to the first sub-scanline Yn1.

The drain of the first driving transistor Qd is connected to the drain of the second switching transistor Qs2. The source of the second switching transistor Qs2 is connected to the anode of the organic EL device 21. The gate of the second switching transistor Qs2 is connected to the second sub-scanline Yn2.

The source of the first switching transistor Qs1 in the final current-conversion circuit segment 60 having the structure described above is connected to the drain of the second driving transistor Trd included in the current-conversion circuit segment 40. The intermediate current Irn generated in the second driving transistor Trd of the current-conversion circuit segment 40 is supplied to the final current-conversion circuit segment 60, depending on the data current Idata generated in the data-line driving circuit 14.

The ratio of gain factors βd1 and Pc1 of the first driving transistor Qd and the first current-supply transistor Qc, respectively, is predetermined at βd1:βc1=1:9. Therefore, the intermediate current Im passing through the first switching transistor Qs1 included in the final current-conversion circuit segment 60 can be made 10 times the driving current Ie1 generated in the first driving transistor Qd.

Through these sequential changes in a current level, the pixel circuit 50 which supplies the data current Idata about 100 times the driving current Ie1 can be achieved.

The total occupied area St of all the nine transistors in the pixel circuit 50 is the sum of the occupied areas of the transistors included in both the current-conversion circuit segment 40 and the final current-conversion circuit segment 60, that is, the sum of the occupied areas SQc and STrc of the first and second current-supply transistors Qc and Trc, respectively, the occupied areas SQd and STrd of the first and second driving transistors Qd and Trd, respectively, and the occupied areas of the first, second, third, fourth, and fifth switching transistors Qs1, Qs2, Trs, Qs4, and Qs5, respectively. The total occupied area St of all the nine transistors may be expressed as follows:

$$St = SQc + STrc + SQd + STrd + SQs1 + SQs2 + STrs + SQs4 + SQs5$$

where the occupied areas of the first, second, third, fourth, and fifth switching transistors Qs1, Qs2, Trs, Qs4, and Qs5 are indicated by SQs1, SQs2, STrs, SQs4, and SQs5, respectively.

The total occupied area St of all the nine transistors may also be expressed as follows:

$$St = 9SQd + 10STrd + SQd + STrd + SQs1 + SQs2 + STrs + SQs4 + SQs5$$
$$= 10SQd + 11STrd + SQs1 + SQs2 + STrs + SQs4 + SQs5$$

where the occupied area STrc of the second current-supply transistor Trc is substituted for the occupied area STrd of the second driving transistor Trd, and the occupied area SQc of the first current-supply transistor Qc is substituted for the occupied area SQd of the first driving transistor Qd.

Since all the first, second, third, fourth, and fifth switching transistors Qs1, Qs2, Trs, Qs4, and Qs5, respectively, function as switching transistors, assume that their occupied areas SQs1, SQs2, STrs, SQs4, and SQs5 are substantially equal, and that occupied areas SQs1, SQs2, STrs, SQs4, and SQs5 of the first, second, third, fourth, and fifth switching transistors Qs1, Qs2, Trs, Qs4, and Qs5 are substantially equal to the occupied area SQd of the first driving transistor Qd. In this case, the relationships between the occupied areas SQs1, SQs2, STrs, SQs4, and SQs5 of the first, second, third, fourth, and fifth switching transistors Qs1, Qs2, Trs, Qs4, and Qs5 respectively, and the occupied area SQd of the first driving transistor Qd may be expressed as follows:

$$SQs1 = SQs2 = STrs = SQs4 = SQs5 = SQd$$

Substituting these relationships into the total occupied area St of all the transistors, St may be expressed as follows:

$$St = 10SQd + 11STrd + SQs1 + SQs2 + STrs + SQs4 + SQs5$$
$$= 15SQd + 11STrd$$

If the occupied area SQd of the first driving transistor Qd and the occupied area STrd of the second driving transistor Trd are assumed to be substantially equal, the total occupied area St of all the transistors may be expressed as follows:

$$St = 15SQd + 11STrd$$
$$= 26SQd$$

This shows that the pixel circuit 50 including the final current-conversion circuit segment 60 has the similar effects to those of the first exemplary embodiment.

Figure 6:
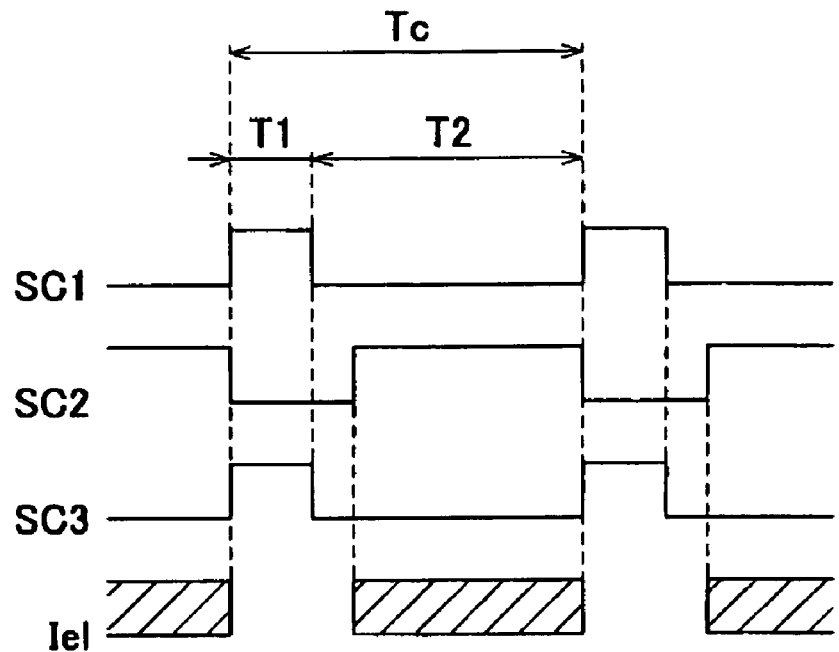
FIG. 6 is a timing chart showing an operation of the pixel circuit according to the second exemplary embodiment of the present invention.

Referring to FIG. 6, a driving process of the pixel circuit 50 having the structure described above is explained. In the pixel circuit 50, during the data writing period T1, the first scanning signal SC1 from the scanline driving circuit 13 is output, via the first sub-scanline Yn1, to turn the first, fourth, and fifth switching transistors Qs1, Qs4, and Qs5, respectively, into an "ON" state. Also in the data writing period T1, the second scanning signal SC2 from the scanline driving circuit 13 is output, via the second sub-scanline Yn2, to turn the second switching transistor Qs2 into an "OFF" state. Likewise in the data writing period T1, the third scanning signal SC3 from the scanline driving circuit 13 is output, via the third sub-scanline Yn3, to turn the third switching transistor Trs into an "ON" state.

Accordingly, in the data writing period T1, the first, fourth, and fifth switching transistors Qs1, Qs4, and Qs5, respectively, are turned into an "ON" state, whereas the second switching transistor Qs2 is turned into an "OFF" state. Also in the data writing period T1, the third switching transistor Trs is turned into an "ON" state.

This allows the data current Idata generated in the data-line driving circuit 14 to be supplied, via the data line Xm, to the current-conversion circuit segment 40. Further, the intermediate current Im that is one-tenth the data current Idata is generated in the second driving transistor Trd which constitutes a current mirror circuit together with the second current-supply transistor Trc.

The intermediate current Im generated in the second driving transistor Trd is, then, supplied to the final current-conversion circuit segment 60. In the final current-conversion circuit segment 60, the amount of charge corresponding to this intermediate current Im is thus stored in the storage capacitor Cn.

Next, in the light-emitting period T2, the first scanning signal SC1 from the scanline driving circuit 13 is output, via the first sub-scanline Yn1, to turn the first, fourth, and fifth switching transistors Qs1, Qs4, and Qs5, respectively, into an "OFF" state. Likewise, the third scanning signal SC3 from the scanline driving circuit 13 is output, via the third sub-scanline Yn3, to turn the third switching transistor Trs into an "OFF" state.

Accordingly, the first, fourth, and fifth switching transistors Qs1, Qs4, and Qs5, respectively, and the third switching transistor Trs are all turned into an "OFF" state.

Subsequently, the second scanning signal SC2 from the scanline driving circuit 13 is output via the second sub-scanline Yn2 and turns the second switching transistor Qs2 into an "ON" state.

Thus, in the first driving transistor Qd, the driving current Ie1 corresponding to the amount of charge stored in the storage capacitor Cn is generated. The driving current Ie1 is one-tenth the intermediate current Im. This driving current Ie1 is supplied to the organic EL device 21 to make it emit light at a luminance and a gray shade corresponding to the data current Idata.

Third Exemplary Embodiment

Figure 7:
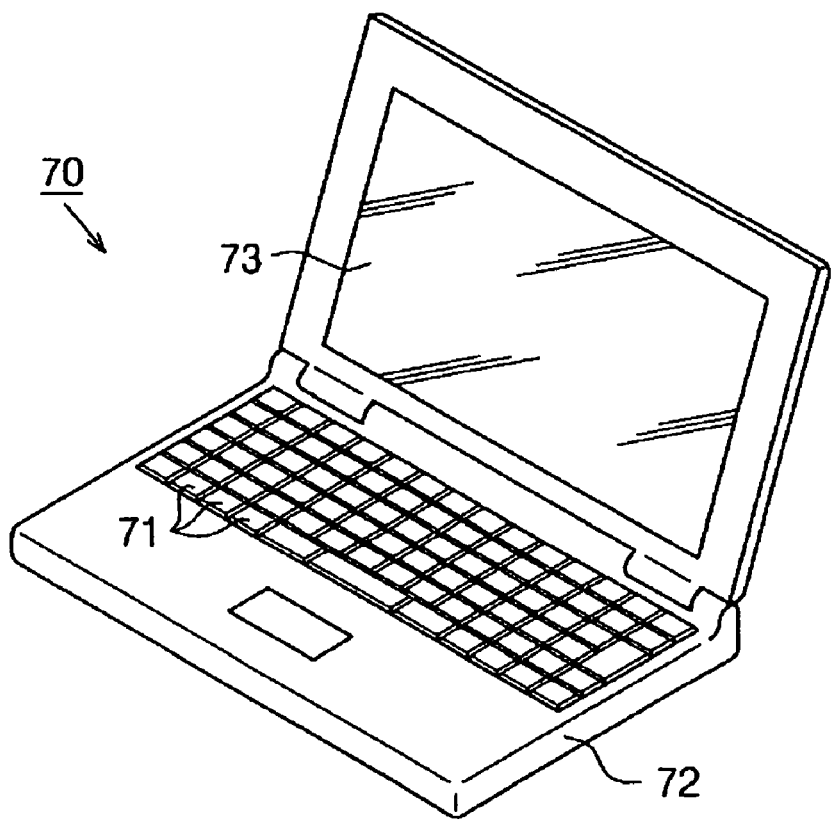
FIG. 7 is a perspective view showing a configuration of a mobile personal computer according to a third exemplary embodiment of the present invention.

Referring to FIG. 7, the organic EL display 10 as an electro-optical unit, which has been illustrated in the first and second exemplary embodiments, is further described in terms of applications to electronic apparatuses. The organic EL display 10 may be applicable to electronic apparatuses, such as mobile personal computers, cellular phones, and digital cameras, for example.

FIG. 7 is a perspective view showing a configuration of a mobile personal computer. In FIG. 7, a personal computer 70 has a main body 72 including a keyboard 71 and a monitor 73 including the organic EL display 10.

The monitor 73 including the organic EL display 10 has similar effects to those of the above exemplary embodiments.

The present invention is not limited to the above-described exemplary embodiments but may include the following exemplary modifications:

(A) In the above-described exemplary embodiments, only one current-conversion circuit segment 40 is connected to the final current-conversion circuit segment 30 or 60, to allow the data current Idata that is 100 times the driving current Ie1 to be supplied to the pixel circuit 20 or 50, respectively. In contrast, a plurality of current-conversion circuit segments 40 may be connected to the final current-conversion circuit segment 30 or 60, to allow the data current Idata that is 100 times the driving current Ie1 to be supplied to the pixel circuit 20 or 50, respectively. This also has the same effect as that in the second exemplary embodiment.

(B) In the above-described exemplary embodiments, the ratio of the gain factor βd1 for the first driving transistor Qd to the gain factor βc1 for the first current-supply transistor Qc is predetermined at 1:10 or 1:9. Further, the ratio of the gain factor βd2 for the second driving transistor Trd to the gain factor βc2 for the second current-supply transistor Trc is predetermined at 1:10. However, the ratio of the gain factor βd1 for the first driving transistor Qd to the gain factor βc1 for the first current-supply transistor Qc may be predetermined at any value besides 1:10 or 1:9. Also, the ratio of the gain factor βd2 for the second driving transistor Trd to the gain factor βc2 for the second current-supply transistor Trc may be predetermined at any value besides 1:10. Thus, an arbitrary amount of data current Idata against the driving current Ie1 may be supplied to the pixel circuit 20 and 50.

(C) The configurations may be exchanged between the first current converter and the second current converter in the second exemplary embodiment. This also has the same effect as that in the second exemplary embodiment.

(D) The polarity of each transistor in the above-described exemplary embodiments may be changed. The same effect as that in the above exemplary embodiments may still be obtained.

(E) While the organic EL device 21 is described in the above exemplary embodiments, other electro-optical devices may also be used. For example, light-emitting devices such as light-emitting diode (LED) and field emission display (FED) may be applicable.

(F) In the above-described embodiments, an electro-optical unit is the organic EL display 10 having the pixel circuit 20 or 50 including the organic EL device 21. The electro-optical unit of other types, for example, a display having a pixel circuit including an inorganic EL device composed of light-emitting layers of inorganic materials, may also be applicable.

(G) In the above-described exemplary embodiments, the organic EL display 10 has the pixel circuit 20 or 50 including the organic EL device 21 of a single color. Organic EL devices 21 of three colors (i.e. red, green, and blue) included in pixel circuit 20 or 50 for each color may also be applicable to the EL display.

What is claimed is:

1. An electronic circuit, comprising:
a first current converter that converts a first current signal input to a second current signal having a value different from the first current signal;
a second current converter that converts a third current signal input to a fourth current signal having a value different from the third current signal; and
an electronic device to which the second current signal is input;
the fourth current signal being the first current signal.

2. The electronic circuit according to claim 1, the first current converter having a current storage to retain at least one of the first current signal and the second current signal.

3. The electronic circuit according to claim 1, the first current converter having a plurality of transistors with different gains.

4. The electronic circuit according to claim 1, the second current converter having a plurality of transistors with different gains.

5. The electronic circuit according to claim 1, the electronic device being a current drive device.

6. The electronic circuit according to claim 5, the current drive device being an electroluminescent device.

7. An electronic apparatus, comprising:
the electronic circuit according to claim 1.

8. The electronic circuit according to claim 1, wherein the second current converter includes two MOSFET transistors configured as a current-mirror.

9. An electro-optical unit, comprising:
a plurality of data lines;
a plurality of scan lines;
a plurality of electro-optical devices; and
a plurality of unit electronic circuits, each unit electronic circuit including:
a first current converter that is connected to the plurality of scan lines and converts a first current signal input to a second current signal having a value different from the first current signal; and
a second current converter that is connected to one of the plurality of data lines and converts a third current signal input to a fourth current signal having a value different from the third current signal;
the second current signal being input to the electro-optical devices; and
the fourth current signal being the first current signal.

10. The electro-optical unit according to claim 9, the second current converter having a plurality of transistors with different gains.

11. The electro-optical unit according to claim 9, the electro-optical device being an organic electroluminescent device.

12. The electro-optical unit according to claim 9, the first current converter having a storage to retain at least one of the first current signal and the second current signal.

13. An electronic apparatus, comprising:
the electro-optical unit according to claim 9.

14. The electro-optical unit according to claim 9, the first current converter having a plurality of transistors with different gains.

15. The electro-optical unit according to claim 9, wherein the second current converter includes two MOSFET transistors configured as a current-mirror.

* * * * *